United States Patent
Kakinuma et al.

[11] Patent Number: 6,114,940
[45] Date of Patent: *Sep. 5, 2000

[54] BALUN TRANSFORMER CORE MATERIAL, BALUN TRANSFORMER CORE AND BALUN TRANSFORMER

[75] Inventors: Sei Kakinuma; Kouki Sato; Masahiro Onizuka; Ko Ito, all of Akita-ken, Japan

[73] Assignee: TDK Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/094,473

[22] Filed: Jun. 10, 1998

[30] Foreign Application Priority Data

Jun. 17, 1997 [JP] Japan ................................ 9-176322

[51] Int. Cl.$^7$ ...................................................... H01F 27/28
[52] U.S. Cl. ................................................ 336/233; 336/212
[58] Field of Search ........................... 336/233, 212, 336/171, 170; 252/62.56, 62.58, 221

[56] References Cited

U.S. PATENT DOCUMENTS

| | | | |
|---|---|---|---|
| 4,366,520 | 12/1982 | Finke et al. | 361/45 |
| 4,543,208 | 9/1985 | Horie et al. | 252/62.54 |
| 4,689,546 | 8/1987 | Stephens et al. | 322/99 |
| 4,785,273 | 11/1988 | Doty | 336/61 |
| 5,350,628 | 9/1994 | Kugimiya et al. | 428/307 |
| 5,838,215 | 11/1998 | Gu et al. | 333/181 |
| 5,846,448 | 12/1998 | Yasuhara et al. | 252/62.56 |

FOREIGN PATENT DOCUMENTS

| | | |
|---|---|---|
| 61-208913 | 9/1986 | Japan . |
| 62-090911 | 4/1987 | Japan . |

OTHER PUBLICATIONS

Chemistry of the Elements, Greenwood and Earnshaw, pp. 1254–1256 (No Date).

*Primary Examiner*—Lincoln Donovan
*Assistant Examiner*—Tuyên T. Nguyên
*Attorney, Agent, or Firm*—Oblon, Spivak, McClelland, Maier & Neustadt, P.C.

[57] ABSTRACT

There is disclosed a BALUN transformer core material which has no magnetic permeability, contains a non-magnetic material and is not influenced by the frequency property of the magnetic permeability even in a high-frequency band. A BALUN transformer core which is obtained by pressing and sintering the BALUN transformer core material has no magnetic permeability and has a high specific resistance. A BALUN transformer which is obtained by applying a winding to the BALUN transformer core is a high-property BALUN transformer which can be operated in a high-frequency band of 600 MHz or more.

16 Claims, 4 Drawing Sheets

BALUN TRANSFORMER CORE MATERIAL, BALUN TRANSFORMER CORE AND BALUN TRANSFORMER

BACKGROUND OF THE INVENTION (i) Field of the Invention

The present invention relates to a BALUN transformer core material, a BALUN transformer core which is obtained by pressing and sintering the BALUN transformer core material and a BALUN transformer which can be operated in a frequency band of 600 MHz or more.

(ii) Description of the Related Art

The BALUN transformer (Balance to Unbalance transformer: hereinafter abbreviated as BALUN) is a conversion component for smoothly connecting an unbalance circuit and a balance circuit, and used for various electronic apparatus, e.g., an antenna in a communication circuit and the like. Additionally, since the electronic apparatus have been made compact and operated at a high frequency in recent years, an essential countermeasure needs to be taken on constituent components of the electronic apparatus. The BALUN transformer is not an exception.

The BALUN transformer usually has a structure in which a conductor wire constituted of a metal is wound double around a toroidal or solenoid BALUN transformer core to form a winding (bifilar winding). As the BALUN transformer core, there is used a BALUN transformer core which is obtained by pressing and sintering a BALUN transformer core material having a magnetic permeability, e.g., a spinel Ni—Cu—Zn ferrite as an oxide magnetic material. The spinel Ni—Cu—Zn ferrite has a relatively high specific resistance, and is not only used as the BALUN transformer core material but also frequently used in a high-frequency coil or other various electronic components.

However, the magnetic permeability of the spinel ferrite including the Ni—Cu—Zn ferrite has a frequency property. The magnetic permeability is reduced in a band of frequencies higher than frequencies at which ferrite starts resonance. Sufficient properties of the BALUN transformer cannot be obtained. There arises a problem that the core material cannot catch up with the high-frequency operation of the BALUN transformer.

To solve the problem, by lowering the magnetic permeability of the spinel ferrite and shifting the frequency at which resonance starts toward a high-frequency side to reduce a resonance loss, the BALUN transformer operable at a high frequency can be obtained. However, the ferrite has a logic of "Snake's limiting line". Therefore, it is impossible to raise the frequency at which the resonance starts up to a high-frequency band exceeding the limitation. A BALUN transformer cannot be realized which provides an excellent property in the high-frequency band.

SUMMARY OF THE INVENTION

An object of the present invention is to provide a BALUN transformer core material and a BALUN transformer core which can realize a high-property BALUN transformer which can be operated in a high-frequency band of 600 MHz or more and to provide a BALUN transformer which can be operated in a high-frequency band of 600 MHz or more.

To attain this and other objects, the present invention provides a BALUN transformer core material which contains a non-magnetic material. Since the non-magnetic material contained in the BALUN transformer core material has no magnetic permeability, the core material is not influenced by the frequency property of the magnetic permeability which has been a problem of the conventional spinel ferrite in the high-frequency band.

Furthermore, the BALUN transformer core of the present invention is constituted of a sintered material which is obtained by pressing and sintering the BALUN transformer core material which contains the non-magnetic material. The BALUN transformer core has no magnetic permeability and has a high specific resistance.

Moreover, the BALUN transformer of the present invention is obtained by applying a winding to the BALUN transformer core constituted of a sintered material which is obtained by pressing and sintering the BALUN transformer core material containing the non-magnetic material. The BALUN transformer is provided with superior properties in the high-frequency band of 600 MHz or more at which the properties of the BALUN transformer constituted of the conventional spinel ferrite are deteriorated. The compact BALUN transformer with high properties have opened up possibilities of making chips.

DETAILED DESCRIPTION OF THE PREFERRED EMBODIMENTS

Figure 1:
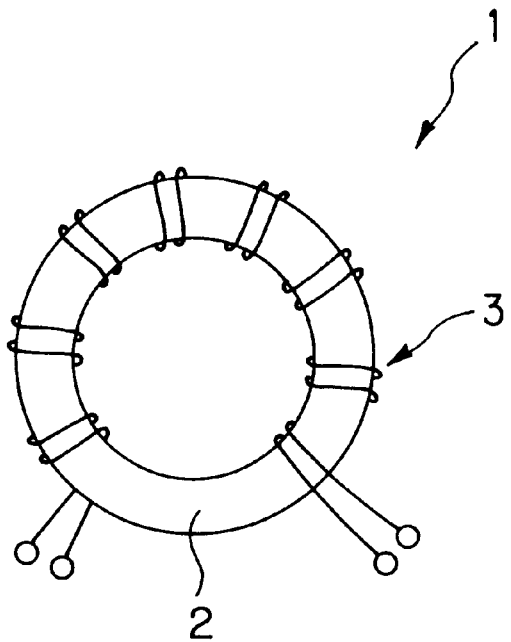
FIG. 1 is a plan view showing an example of a BALUN transformer according to the present invention.

Preferable embodiments of the present invention will be described with reference to the accompanying drawings.

BALUN Transformer Core Material

First, a BALUN transformer core material of the present invention will be described.

The BALUN transformer core material of the present invention contains a non-magnetic material. As the non-magnetic material used in the present invention available is aluminum oxide, iron oxide, forsterite, glass or the like. In the non-magnetic material, an α-alumina powder can be used as aluminum oxide. Alternatively, the non-magnetic material may contain one type or two or more types of powders such as the α-alumina powder as a main component, a β-alumina powder, a γ-alumina powder and the like. Furthermore, as the iron oxide, one type of powder or a combination of two or more types of powders such as a $Fe_2O_3$ powder, a $Fe_3O_4$ powder (magnetite) and the like can be used. The average particle size of the non-magnetic material is preferably in a range of 0.1 to 30 $\mu$m.

Alternatively, the BALUN transformer core material of the present invention may contain a binder described later together with the non-magnetic material. In this case, the content of the non-magnetic material in the BALUN transformer core material is preferably 90% by weight or more.

BALUN Transformer Core

A BALUN transformer core of the present invention will be described.

The BALUN transformer core of the present invention is obtained by mixing the BALUN transformer core material and the binder, pressing the mixture into a predetermined configuration and sintering a pressed material at a high temperature. For example, the density of the BALUN transformer core as a sintered material is 3.5 to 4.3 g/cc, preferably 3.8 to 4.0 g/cc when aluminum oxide is used as the non-magnetic material, and 4.2 to 5.3 g/cc, preferably 4.5 to 5.0 g/cc when iron oxide is used as the non-magnetic material. Additionally, the dielectric constant $\epsilon$ of the BALUN transformer core is preferably in a range of 9 to 23.

As the binder, aqueous solution of polyvinyl alcohol (PVA), polyethylene glycol (PEG) or the like, or water can be used. Furthermore, two or more types of PVA having different polymerization degrees may be mixed. In the aqueous solution, the proportion of PVA or another solid content is preferably in a range of 0.5 to 15% by weight. The mixing proportion of the binder and the BALUN transformer core material can be set in such a manner that 1 to 15 parts by weight of binder is mixed relative to 100 parts by weight of the BALUN transformer core material. Alternatively, the binder may contain 0 to 2.0% by weight of one type or more types of dispersing agent such as a carboxylic acid dispersant, a sulfonic acid dispersant and the like. Additionally, when a binder is further mixed with the BALUN transformer core material containing a binder, 1 to 15 parts by weight of binder is mixed relative to 100 parts by weight of the non-magnetic material as the BALUN transformer core material.

The configuration of the BALUN transformer core according to the present invention may be the same as the configuration of the conventional BALUN transformer core such as a toroidal configuration, a solenoid configuration, a configuration of a pair of glasses or the like.

The BALUN transformer core of the present invention has no magnetic permeability and has a specific resistance of $10^6$ $\Omega$.cm or more. The specific resistance has the same degree as that of the conventional BALUN transformer core in which the spinel Ni—Cu—Zn ferrite is used. When the specific resistance of the BALUN transformer core is low ($10^4$ $\Omega$.cm or less), the insulation between the core and the winding and between core electrodes cannot be kept unfavorably.

BALUN Transformer

A BALUN transformer of the present invention will be described.

The BALUN transformer of the present invention has a structure in which a conductor wire constituted of a metal is wound double around the BALUN transformer core of the present invention to form a winding (bifilar winding).

Figure 2:
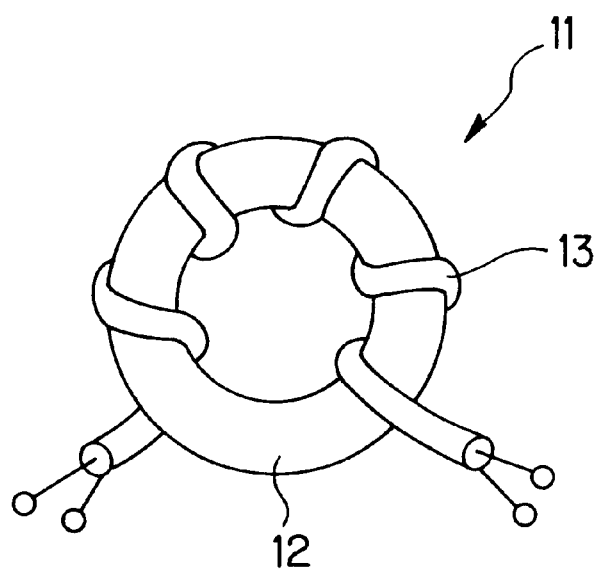
FIG. 2 is a plan view showing another example of the BALUN transformer according to the present invention.
Figure 3:
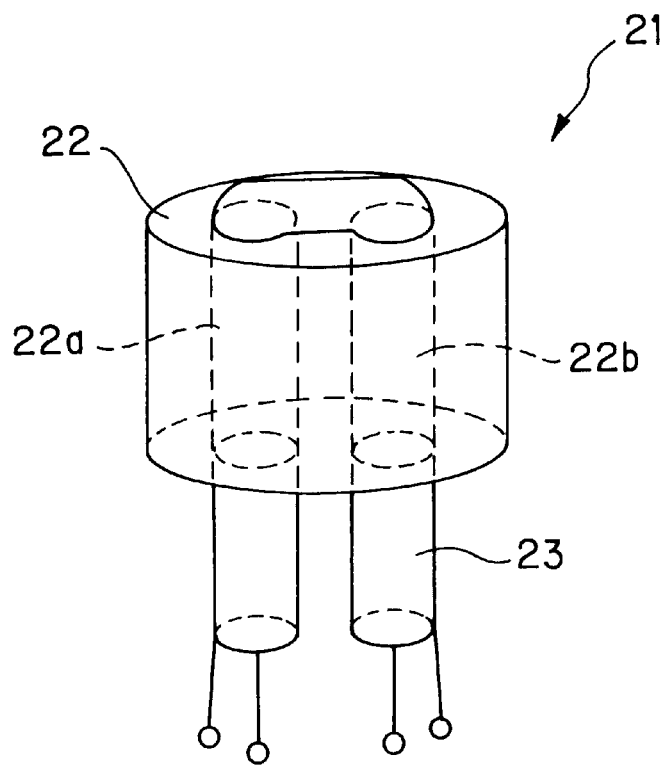
FIG. 3 is a perspective view showing another example of the BALUN transformer according to the present invention.

Examples of the BALUN transformer according to the present invention are shown in FIGS. 1 to 3. A BALUN transformer 1 of the present invention shown in FIG. 1 is constituted by winding a paired wire 3 around a toroidal BALUN transformer core 2 and thus applying a winding. A BALUN transformer 11 of the present invention shown in FIG. 2 is constituted by winding a coaxial wire 13 around a toroidal BALUN transformer core 12 and thus applying a winding. Furthermore, a BALUN transformer 21 of the present invention shown in FIG. 3 is constituted by applying a coaxial wire 23 to a BALUN transformer core 22 configured like a pair of glasses which is provided with through holes 22a and 22b.

The number of windings in the BALUN transformer of the present invention can be appropriately set in accordance with the operating purpose of the BALUN transformer, the configuration of the BALUN transformer core, the used conductor wire and the like. For example, about one turn to three turns of winding may be used.

Embodiment

Concrete examples of the present invention will be shown to describe the present invention in more detail.

Preparation of BALUN Transformer Cores (Samples 1–3)

Figure 4:
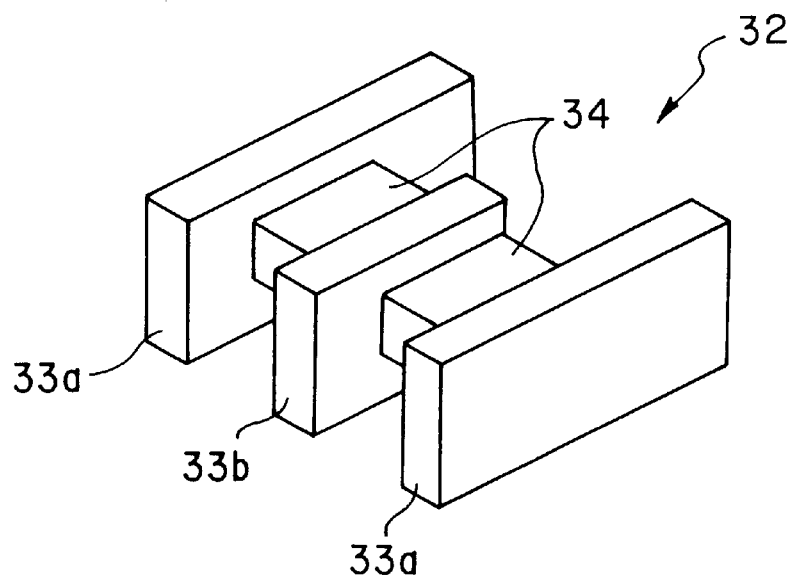
FIG. 4 is a perspective view showing a configuration of a BALUN transformer core in an embodiment.

First, a BALUN transformer core material constituted of an $\alpha$-alumina powder (with an average particle size of 0.5 $\mu$m) as a non-magnetic material was used to prepare a paste having a composition described below. By using the paste, an E-shaped BALUN transformer core 32 shown in FIG. 4 and disc-shaped samples were pressed (pressing pressure 1 t/cm$^2$) and sintered at temperatures shown in Table 1 in an air atmosphere for two hours. In the core 32, as shown in FIG. 4, three blocks 33a, 33a and 33b are interconnected with two blocks 34.

Paste Composition

BALUN transformer core material . . . 90 parts by weight

Binder . . . 10 parts by weight an 6% aqueous solution of polyvinyl alcohol (PVA124, manufactured by Kurare Co., Ltd.)

The density, the dielectric constant and the specific resistance of the obtained BALUN transformer cores (samples 1–3) were measured and shown in Table 1. Additionally, the dielectric constant and the specific resistance were measured in the following method:

Measurement Method of Dielectric Constant

An In-Ga electrode is placed on an end surface of a disc-shaped sample. The capacity of 1 MHz is measured with an LCR meter (4275A manufactured by Furet Paccard Co., Ltd.). The dielectric constant is calculated from an outside dimension of the sample.

Measurement Method of Specific Resistance

An In-Ga electrode is placed on an end surface of a disc-shaped sample. The insulation resistance is measured with an insulation testing set (SUPER MEG OHM METER SM-5E manufactured by Toa Denpa Kogyo Kabushiki Kaisha). The specific resistance is calculated from an outside dimension of the sample.

TABLE 1

| Sample | Sintering Temp. (° C.) | Density (g/cc) | Dielectric Constant $\epsilon$ | Specific Resistance ($\Omega \cdot$ cm) |
|---|---|---|---|---|
| Sample 1 | 1200 | 3.8 | 9.4 | $2 \times 10^{10}$ |
| Sample 2 | 1250 | 3.9 | 9.6 | $3 \times 10^{10}$ |
| Sample 3 | 1300 | 4.0 | 9.8 | $5 \times 10^{10}$ |

It has been confirmed that each of the BALUN transformer cores (samples 1–3) has a density in a range of 3.8 to 4.0 g/cc, a dielectric constant $\epsilon$ in a range of 9 to 10 and a specific resistance in a level of $10^{10}$ $\Omega$.cm.

Preparation of BALUN Transformer Cores (Samples 4–7)

Additionally, a BALUN transformer core material constituted of an iron oxide as the non-magnetic material (Fe$_2$O$_3$ powder with an average particle size of 0.8 $\mu$m) was used to prepare a paste having a composition described below. By using the paste, the E-shaped BALUN transformer core 32 and disc-shaped samples were pressed (pressing pressure 1 t/cm$^2$) and sintered at temperatures shown in Table 2 in an air atmosphere for two hours. In the core 32, as shown in FIG. 4, three blocks 33a, 33a and 33b are interconnected with two blocks 34.

Paste Composition

BALUN transformer core material . . . 90 parts by weight binder . . . 10 parts by weight an 6% aqueous solution of polyvinyl alcohol (PVA124, manufactured by Kurare Co., Ltd.)

The density, the dielectric constant and the specific resistance of the obtained BALUN transformer cores (samples 4–7) were measured in the same manner as aforementioned, and shown in Table 2

TABLE 2

| Sample | Sintering Temp. (° C.) | Density (g/cc) | Dielectric Constant $\epsilon$ | Specific Resistance ($\Omega \cdot$ cm) |
|---|---|---|---|---|
| Sample 4 | 1040 | 4.5 | 17.4 | $3 \times 10^8$ |
| Sample 5 | 1060 | 4.7 | 18.1 | $1 \times 10^9$ |
| Sample 6 | 1080 | 4.9 | 20.7 | $5 \times 10^9$ |
| Sample 7 | 1100 | 5.0 | 22.9 | $6 \times 10^9$ |

It has been confirmed that each of the BALUN transformer cores (samples 4–7) has a density in a range of 4.5 to 5.0 g/cc, a dielectric constant $\epsilon$ in a range of 17 to 23 and a specific resistance in a range of $10^7$ to $10^{10}$ $\Omega$.cm.

Preparation of BALUN Transformer Cores (Comparative Samples)

Additionally, a comparative sample was prepared. First, NiO, CuO, ZnO and $Fe_2O_3$ were weighed to provide a composition converted in terms of oxide (mol %), i.e., 42NiO.4CuO.6ZnO.48$Fe_2O_3$. After wet-blending in a ball mill, a pre-sintering was performed at a temperature of 900° C. in an air atmosphere for two hours. Thereafter, a wet-grinding was performed in the ball mill to form a BALUN transformer core material constituted of a spinel Ni—Cu—Zn ferrite. By using the BALUN transformer core material, a paste was prepared in the same manner as aforementioned. Then, the E-shaped BALUN transformer core 32 (comparative sample) shown in FIG. 4 was prepared.

Preparation of BALUN Transformer

Figure 5:
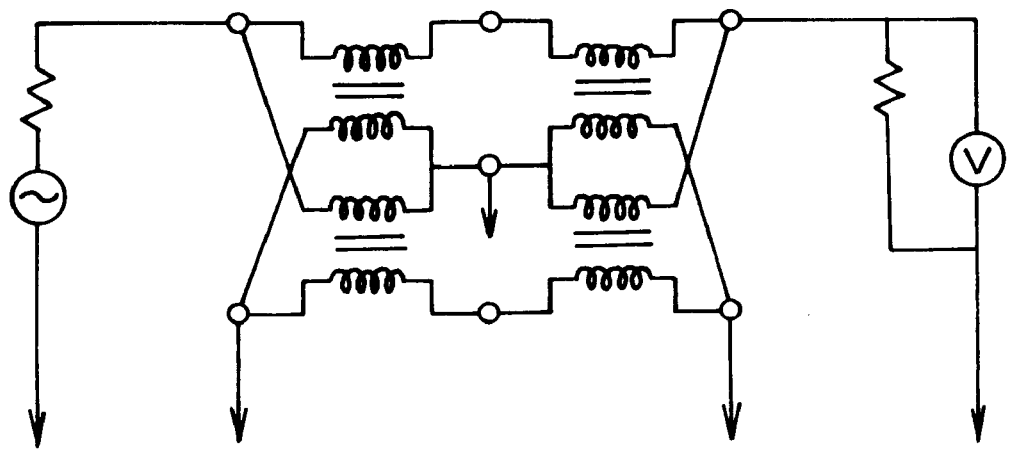
FIG. 5 is a circuit diagram showing a measurement circuit of an insertion loss in the embodiment.
Figure 6:
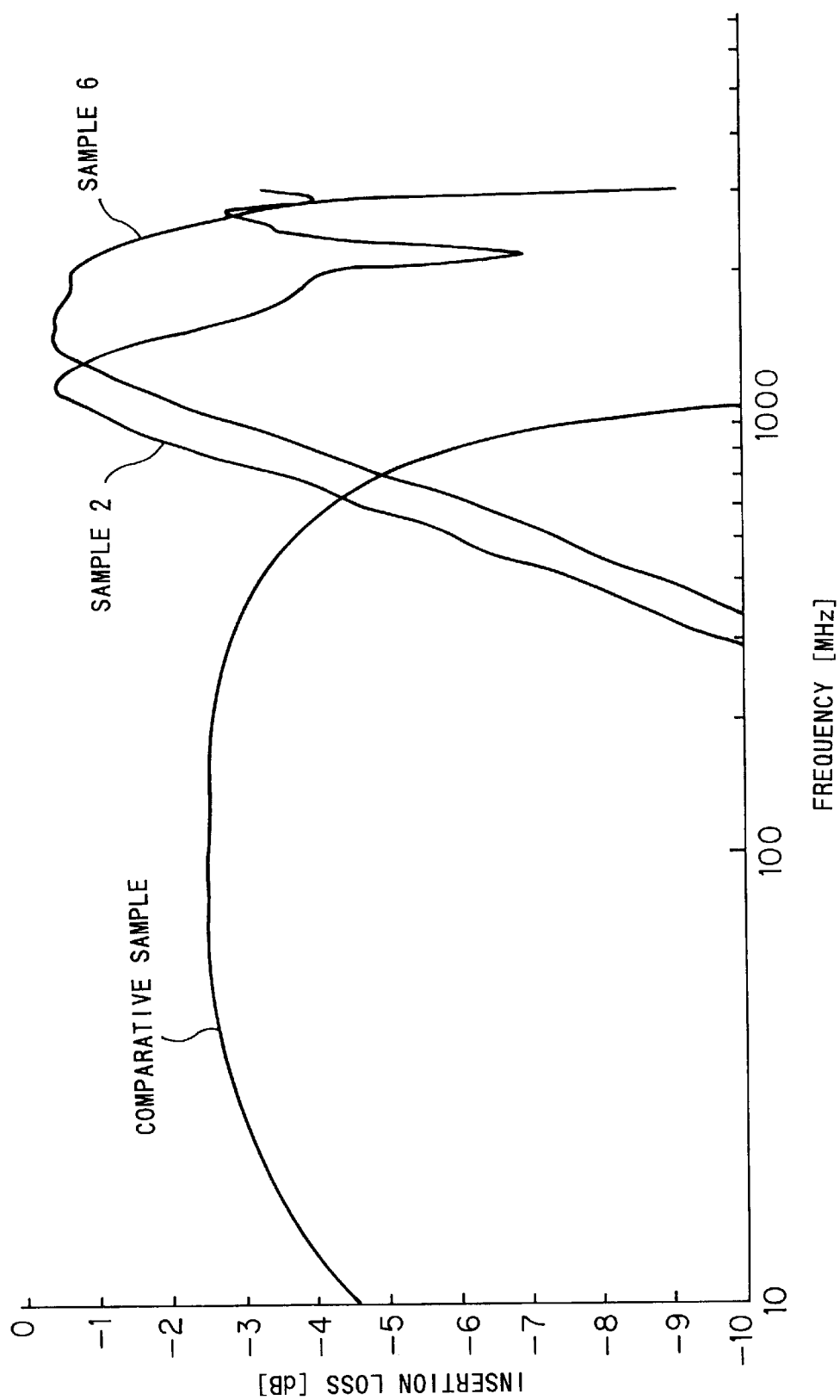
FIG. 6 is a graph showing measurement results of the insertion loss of the BALUN transformer in the embodiment.

Subsequently, paired wires were wound around the block of the sample 2 (with the $\alpha$-alumina powder used therein), the sample 6 (with the $Fe_2O_3$ powder used therein) and the E-shaped BALUN transformer core as the comparative sample to form a winding (one turn). For the prepared BALUN transformers, the insertion loss was measured in a measurement circuit shown in FIG. 5 by using a network analyzer (HP-8753 manufactured by Furet Paccard Co., Ltd.). Results are shown in FIG. 6. Additionally, in the measurement circuit shown in FIG. 5, to enhance a measurement precision, two BALUN transformers prepared as aforementioned are connected in series. Therefore, the insertion loss shown in FIG. 6 is a double value. Therefore, when the insertion loss is −3 dB in FIG. 6, the insertion loss of one BALUN transformer is −1.5 dB. The closer to 0 dB the insertion loss is, the more superior the property of the BALUN transformer becomes.

As shown in FIG. 6, a frequency band in which an insertion loss of −5 dB or more can be obtained is 580 MHz to 2 GHz in the sample 2 of the BALUN transformer of the present invention, and 700 MHz to 2.8 GHz in the sample 6 of the BALUN transformer of the present invention. Furthermore, a frequency band in which an insertion loss of −2 dB or more can be obtained is 850 MHz to 1.4 GHz in the sample 2 of the BALUN transformer of the present invention, and 1.1 to 2.5 GHz in the sample 6 of the BALUN transformer of the present invention. The samples have remarkably small insertion losses in the high-frequency band as compared with the comparative sample of the BALUN transformer. It has been confirmed that the BALUN transformer of the present invention can be operated in a high-frequency band of 600 MHz or more.

What is claimed is:

1. A BALUN transformer comprising a BALUN transformer core and a bifilar winding around the BALUN transformer core, wherein the BALUN transformer core consists essentially of at least one non-magnetic material selected from the group consisting of an aluminum oxide and a non-magnetic iron oxide.

2. The BALUN transformer according to claim 1 wherein a content of aluminum oxide is 90% by weight or more.

3. The BALUN transformer according to claim 2 wherein a density of the sintered material is in a range of 3.5 to 4.3 g/cc.

4. The BALUN transformer according to claim 2 wherein a density of the sintered material is in a range of 3.8 to 4.0 g/cc.

5. The BALUN transformer according to claim 1, wherein a content of iron oxide is 90% by weight or more.

6. The BALUN transformer according to claim 5 wherein a density of the sintered material is in a range of 4.2 to 5.3 g/cc.

7. The BALUN transformer according to claim 5 wherein a density of the sintered material is in a range of 4.5 to 5.0 g/cc.

8. The BALUN transformer according to claim 1, wherein said transformer core material consists of said at least one non-magnetic material.

9. A BALUN transformer comprising:
   a core consisting essentially of at least one non-magnetic material, and
   a bifilar winding of conductor wire, wherein
      said non-magnetic material is selected from the group consisting of an aluminum oxide and a non-magnetic iron oxide.

10. A method of connecting an unbalanced circuit and a balanced circuit, comprising:
    providing a BALUN transformer; and
    connecting said unbalanced circuit and said balanced circuit with said BALUN transformer; wherein said BALUN transformer comprises:
       a core consisting essentially of at least one non-magnetic material, and
       a bifilar winding of conductor wire; and wherein
          said non-magnetic material is selected from the group consisting of an aluminum oxide and a non-magnetic iron oxide.

11. The BALUN transformer of claim 9, wherein said core has a density of 3.5 to 4.3 g/cc.

12. The BALUN transformer of claim 9, wherein said core has a density of 4.2 to 5.3 g/cc.

13. The method of claim 10, wherein said core has a density of 3.5 to 4.3 g/cc.

14. The method of claim 10, wherein said core has a density of 4.2 to 5.3 g/cc.

15. The BALUN transformer according to claim 9, wherein said core consists of said at least one non-magnetic material.

16. The method according to claim 10, wherein said core consists of said at least one non-magnetic material.

* * * * *